United States Patent [19]
Markert et al.

[11] Patent Number: 6,144,590
[45] Date of Patent: Nov. 7, 2000

[54] SEMICONDUCTOR MEMORY HAVING DIFFERENTIAL BIT LINES

[75] Inventors: Michael Markert, Augsburg; Musa Saglam, München; Sabine Schoniger, München; Peter Schrögmeier, München; Stefan Dietrich, Türkenfeld; Thomas Hein, München; Thilo Marx, München, all of Germany

[73] Assignee: Siemens Aktiengesellschaft, Munich, Germany

[21] Appl. No.: 09/315,328

[22] Filed: May 20, 1999

[30] Foreign Application Priority Data

May 20, 1998 [DE] Germany .......................... 198 22 750

[51] Int. Cl.[7] .................................................. G11C 7/00
[52] U.S. Cl. ......................... 365/190; 365/149; 365/207
[58] Field of Search ..................... 365/190, 149, 365/207, 208; 257/390, 401

[56] References Cited

U.S. PATENT DOCUMENTS

| | | | |
|---|---|---|---|
| 4,476,547 | 10/1984 | Miyasaka | 365/205 |
| 4,875,192 | 10/1989 | Matsumoto | 365/193 |
| 4,979,013 | 12/1990 | Furutani et al. | 357/55 |
| 5,280,443 | 1/1994 | Hidaka et al. | 365/63 |
| 5,383,159 | 1/1995 | Kubota | 365/207 |
| 5,666,319 | 9/1997 | Okmura | 365/205 |
| 5,875,138 | 2/1999 | Hoenigschmid | 365/203 |
| 5,929,494 | 7/1999 | Li | 257/390 |

*Primary Examiner*—Richard Elms
*Assistant Examiner*—Hien Nguyen
*Attorney, Agent, or Firm*—Herbert L. Lerner; Laurence A. Greenberg; Werner H. Stemer

[57] ABSTRACT

In a semiconductor memory, bit lines are disposed in such a way that in each case two inverted and two non-inverted bit lines lie next to one another. Adjacent switching transistors for connecting the bit lines to an inverted or a non-inverted collective line are connected to the corresponding collective line by a common contact. An advantage in terms of area is afforded by the fact that the two switching transistors have a common doping region.

9 Claims, 3 Drawing Sheets

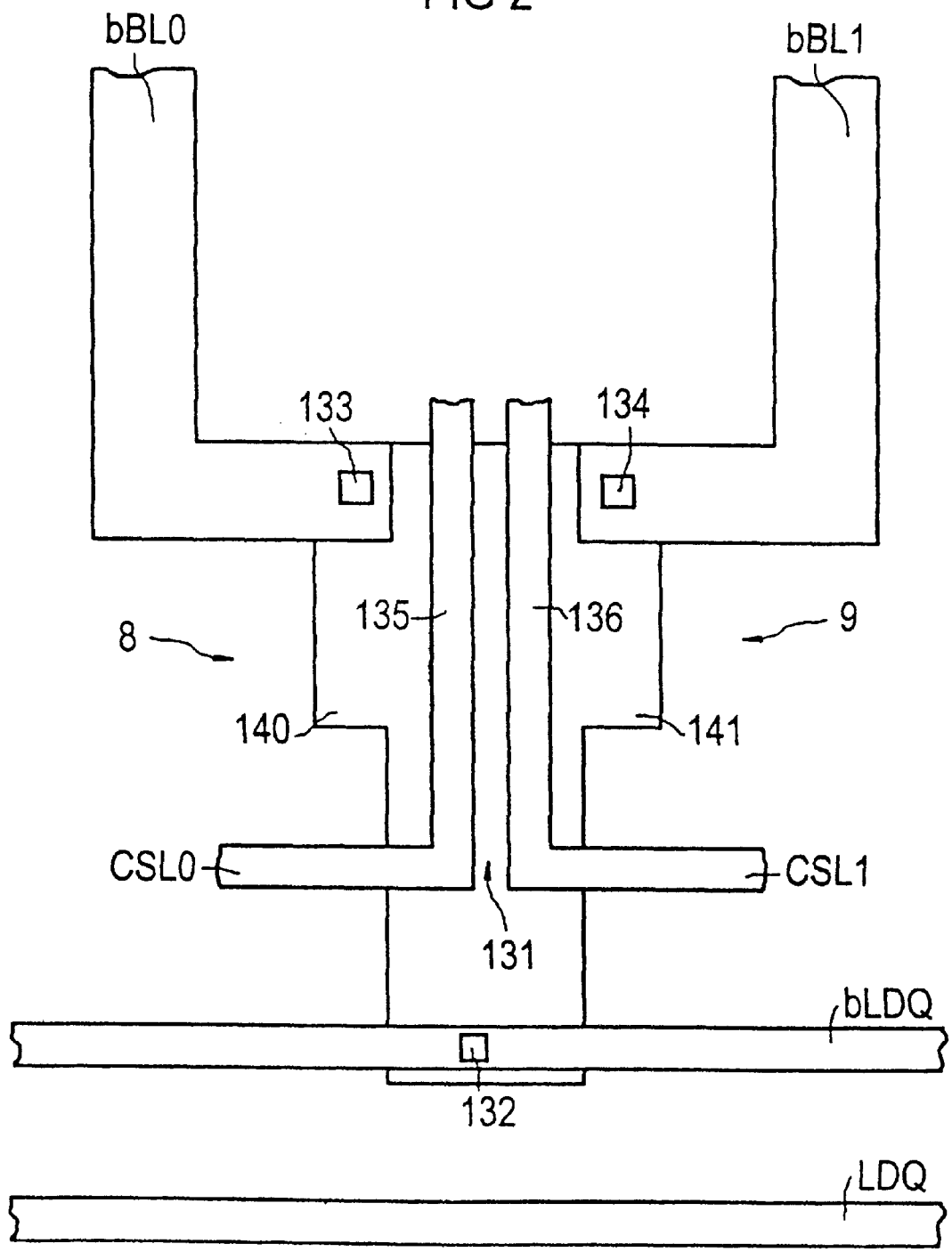

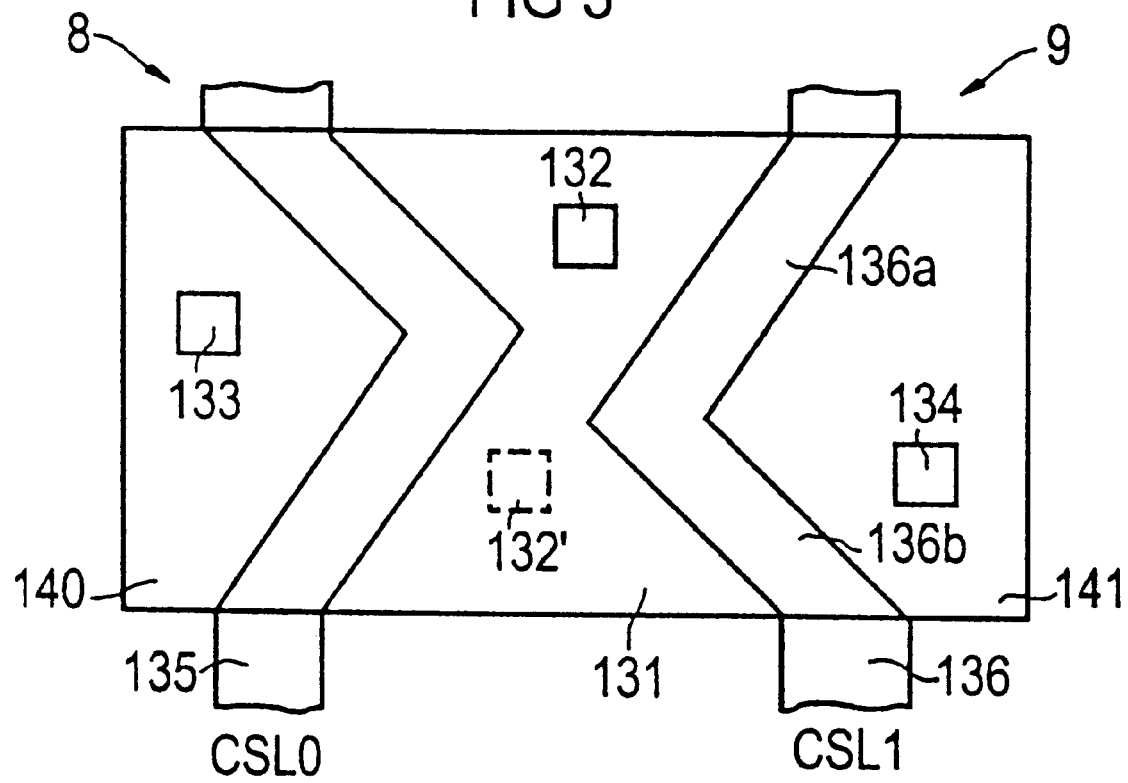

SEMICONDUCTOR MEMORY HAVING DIFFERENTIAL BIT LINES

BACKGROUND OF THE INVENTION

FIELD OF THE INVENTION

The invention relates to a semiconductor memory having inverted and non-inverted bit lines as well as corresponding collective lines and switching transistors connecting them.

As described in U.S. Pat. No. 4,875,192, a semiconductor memory contains a regular, matrix-like configuration of memory cells for storing binary data. A memory cell essentially contains an access transistor and a storage capacitor for storing an information bit. A multiplicity of memory cells are connected to a bit line. The information to be written to and read from the memory cell is provided via the bit line. The desired memory cell is selected via a word line. During the read-out operation, a sense amplifier amplifies the signal read from the memory cell. After the amplification operation, the bit line is connected to a collective line via a switching transistor, the collective line leading to the output of the semiconductor memory.

The sense amplifier is configured as a differential amplifier.

A respective bit line is connected to the differential inputs of the differential amplifier. In a memory cell, either the information bit to be stored is itself stored or its inverted data value is stored, this depending on the differential amplifier input to which the bit line assigned to the memory cell is connected. A bit line has connected to it either only memory cells in which the data information is stored in a non-inverted fashion, or only memory cells in which the data information is stored in an inverted fashion. The corresponding bit lines are therefore referred to as non-inverted or inverted bit lines. Inverted and non-inverted bit lines are disposed alternately next to one another in the configuration shown in U.S. Pat. No. 4,875,192.

U.S. Pat. No. 5,280,443 describes a semiconductor memory in which the bit lines are transposed in order to avoid unbalanced capacitive loading on the bit lines during a memory access. At the sense amplifier end of the bit lines, in each case two inverted and two non-inverted bit lines lie next to one another. The bit lines can be switched to an inverted or non-inverted collective line via switching transistors. In this case, inverted and non-inverted bit lines can be connected to the same collective line.

SUMMARY IF THE INVENTION

It is accordingly an object of the invention to provide a semiconductor memory having differential bit lines which overcomes the above-mentioned disadvantages of the prior art device of this general type, which can be realized in a manner such that it occupies less silicon area.

With the foregoing and other objects in view there is provided, in accordance with the invention, a semiconductor memory, including:

memory cells;

inverted bit lines connected to those of the memory cells storing information to be stored in an inverted fashion and disposed next to one another and carrying the information to be read from the memory cells;

non-inverted bit lines connected to those of the memory cells storing the information to be stored in a non-inverted fashion, in each case two of the inverted bit lines and in each case two of the non-inverted bit lines disposed such that they are adjacent to each other without a further bit line situated between them and defining adjacent bit lines;

switching transistors in that in each case a switching transistor connected to one of the inverting bit lines and the non-inverting bit lines; and collective lines including an inverted collective line connected to the switching transistors connected to the inverted bit lines and a non-inverted collective line connected to the switching transistors connected to the non-inverted bit lines.

In the case of the semiconductor memory according to the invention, in each case two inverted bit lines and in each case two non-inverted bit lines are disposed directly next to one another, i.e. without a further bit line situated in between. In comparison with previous memory architectures, there is a change in the order of the bit lines with regard to their assignment for the storage of inverted or non-inverted information. The consequence of this is that two respective contacts for connecting the bit lines to the same collective line lie spatially next to one another. These contacts are expediently combined to form a single contact. In addition, it is advantageous to combine the doping regions of the switching transistors that connect the bit lines through to the collective line to form a single doping region. Area is gained as a result of this. By contrast, in U.S. Pat. No. 4,875,192, the doping regions of the corresponding switching transistors for connection to the collective lines have to be alternately contact-connected to the inverted or non-inverted collective line. It is advantageous for the gate electrodes of the switching transistors to have a bent profile. The area gain in the direction of the collective line is thereby converted, with the effective transistor geometry being maintained, into an area gain acting perpendicularly thereto, in the direction of the bit lines. The total area occupied by the semiconductor chip is consequently reduced.

Other features which are considered as characteristic for the invention are set forth in the appended claims.

Although the invention is illustrated and described herein as embodied in a semiconductor memory having differential bit lines, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 a fragmentary, plan view of a layout of two switching transistors which connect bit lines to a collective data line; and FIG. 3 is a fragmentary, plan view of a corresponding layout with gate electrodes having a bent profile.

DESCRIPTION OF THE PREFERRED EMBODIMENTS

Figure 1:
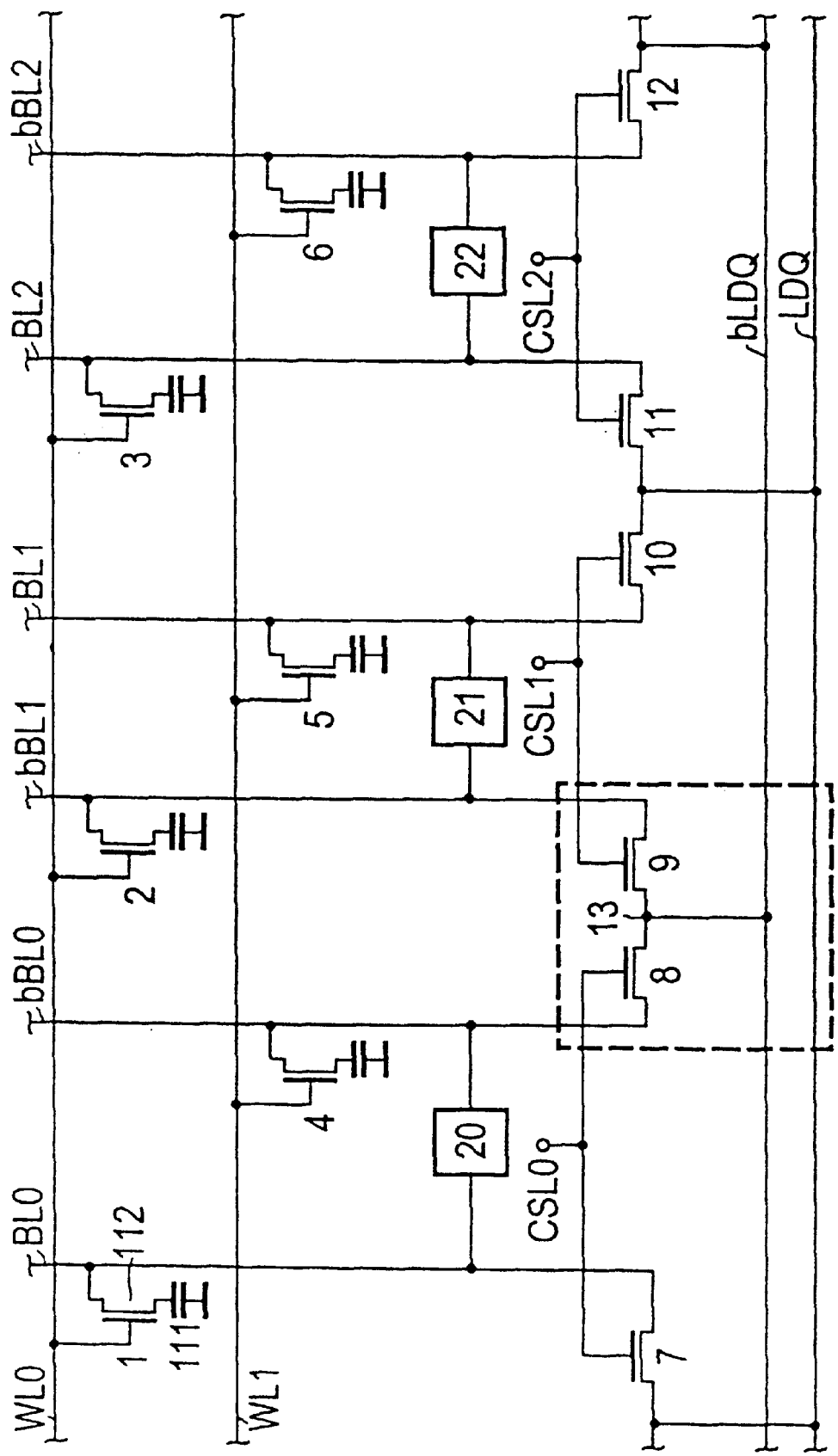
FIG. 1 is a diagrammatic, basic circuit diagram of a semiconductor memory according to the invention.

In all the figures of the drawing, sub-features and integral parts that correspond to one another bear the same reference symbol in each case. Referring now to the figures of the drawings in detail and first, particularly, to FIG. 1 thereof, there is shown a detail from a memory cell array of a semiconductor memory containing memory cells 1, ..., 6. Each memory cell 1–6 contains a storage capacitor 111, one terminal of which is connected to a reference-ground potential, e.g. ground, and the other terminal of which is connected to a drain-source path of a MOS transistor 112. The other terminal of the MOS transistor 112 is connected to a bit line BL0. In order to read in and read out the data information which is to be stored and is stored, respectively, in the capacitor 111, the transistor 112 is switched on by a corresponding control signal on a word line WL0, with the result that the capacitor 111 is conductively connected to the bit line BL0. The other memory cells 2, ..., 6 are configured correspondingly. The bit line bBL0 is disposed directly next to the bit line BL0. The memory cell 4, whose selection transistor can be driven via another word line WL1, is connected to the bit line bBL0.

The two bit lines BL0, bBL0 are connected to a sense amplifier 20 on input and output sides. When data information is read from the memory cells 1 or 4, the corresponding signal from the storage capacitor 111 is applied to the respective bit line BL0 or bBL0 and amplified by the sense amplifier 20. The sense amplifier 20 is configured as a differential amplifier. The stored information bit is stored in a non-inverted fashion in the memory cell 1, since the bit line BL0 is connected to the non-inverting, amplifying input of the sense amplifier 20. The information bit stored in the memory cell 4 is stored in an inverted fashion, since the bit line bBL0 is connected to the inverted amplifying input of the sense amplifier 20. The memory cell 2 is connected to the inverted bit line bBL1, and the memory cell 5 is connected to the non-inverted bit line BL1. The two bit lines BL1, bBL1 are connected to the sense amplifier 21 on the input side. In a continuation of this principle, the memory cell 3 is connected to the non-inverted bit line BL2 and the memory cell 6 is connected to the inverted bit line bBL2. The latter bit lines are connected to a sense amplifier 22 on an input side. The memory cells 2, 3 are selected by the word line WL0, and the memory cells 4, 5, 6 are selected by the other word line WL1. The bit lines run parallel to one another. In the viewing direction perpendicular to the course of the bit lines, a first inverted bit line is followed by a second inverted bit line, e.g. bBL0, bBL1. The second inverted bit line is followed by the first non-inverted bit line, e.g. bBL1, BL1. The first non-inverted bit line is followed by the second non-inverted bit line, e.g. BL1, BL2 and the first inverted bit line then follows again, e.g. bBL2, and the sequence of non-inverted and inverted bit lines is repeated. Therefore, there are always exactly two inverted bit lines and two non-inverted bit lines directly next to one another, i.e. without further bit lines situated in between, in the viewing direction perpendicular to the course of the bit lines.

After the amplification operation during the read-out, the data present on the bit lines are output to two collective lines LDQ, bLDQ. The non-inverted collective line LDQ receives the signals of the non-inverted bit lines BL0, BL1, BL2. In a corresponding manner, the inverted collective line bLDQ forwards the read-out data information of the inverted bit lines bBL0, bBL1, bBL2. The bit lines are connected via corresponding switching transistors 7, ..., 12 to the respectively assigned collective lines LDQ, bLDQ. The data bit that has been read out is forwarded via the collective lines LDQ, bLDQ in the direction of the output of the integrated semiconductor memory. Those switching transistors which are assigned to bit lines that lie next to one another and are connected to the same sense amplifier are controlled by a common control signal CSL0, CSL1 and CSL2. Overall, then, during a read-out operation, the data information to be read out is fed into the sense amplifier 20 in a single-ended manner but is provided as a differential data signal on the output side and transferred differentially to the collective lines.

The data from two data lines of the same type (i.e. both inverted or both non-inverted) which are disposed such that they are directly adjacent next to one another are output to the same collective line bLDQ or LDQ. The consequence of this is that respective doping regions, remote from the bit line, of the assigned switching transistors are connected to the same collective line. In the case of the two directly adjacent bit lines bBL0, bBL1, the switching transistors 8, 9 have a common terminal 13, which is contact-connected to the collective line bLDQ. The contact 13 is preferably configured as a single, common contact. This results in simplifications in the layout. More advantageously, the doping regions of the transistors 8, 9 are configured as a common doping region (as illustrated in detail in FIG. 2). As a result of these simplifications, area is gained in the direction of the collective lines bLDQ, LDQ.

Corresponding conditions are produced in all other adjacent bit lines of the same type (i.e. both inverted or both non-inverted). For example, the bit lines BL1, BL2 are connected to the collective line LDQ via the transistors 10, 11, which have a common contact. The same applies to the respective switching transistor pairs containing the transistors 7, 12.

The region which is identified by the dot-dashed line in the vicinity of the transistors 8, 9 in FIG. 1 is illustrated in more detail in FIG. 2 in a plan view of the layout. Corresponding elements are provided with the same reference symbols. The transistors 8, 9 have a common doping region 131. The doping region 131 is connected to the inverted collective line bLDQ via a contact 132. The inverted bit lines bBL0, bBL1 are connected to other doping regions 140, 141, forming the transistors, via contacts 133, 134. Respective gate electrodes 135, 136 of the two transistors 8, 9 run at an edge of the common doping region 131. A channel of the MOS transistor is formed underneath the gate electrodes during operation.

The distance between the gate electrodes 135, 136 amounts at least to the alignment accuracy of the fabrication process, that is to say at least the minimum gate length. By contrast, in the case of a conventional realization of corresponding transistors by separate doping regions, the corresponding gate electrodes would have a minimum distance of three times the minimum gate length, which is necessary for the respective separate doping regions and, in addition, the distance between the doping regions itself. An area gain of at least twice the minimum gate length is produced, therefore, in the direction of the collective line. Given the multiplicity of transistor pairs required in semiconductor memories having the capacity that can be fabricated nowadays, the result is an appreciable reduction in the area requirement for realizing such connecting transistors, by which the bit lines are contact-connected to the collective lines. As usual, the bit lines BL0, bBL0, BL1, BL2, bBL2 run in a first metallization plane, while the collective lines bLDQ, LDQ run in another, second metallization plane usually situated above the former. Transpositions of the lines of the same plane are precluded, therefore.

In FIG. 2, the gate electrodes 135, 136 run vertically, and parallel to the direction of the bit lines, along their section which is effective for the transistor function. It is advantageous for the profile of the gate electrodes 135, 136 to be guided in a bent fashion in the direction of the bit lines. In other words, the profile of the gate electrodes 135, 136 across the common doping region 131 contains components both in the direction of the bit line and perpendicularly thereto. As a result, it is possible for the transistor to be configured with a smaller depth, that is to say narrower, in the direction of the bit line, with the transistor function (e.g. W/L ratio) remaining the same. Although this requires the doping regions to be extended in the direction perpendicular to the bit line, i.e. along the collective line, that space which has been obtained by virtue of the common contact to the collective line and, moreover, by virtue of the doping regions of shared configuration is available in this direction. As a result, the collective lines bLDQ, LDQ can be placed nearer to the memory cell array. The area of the semiconductor chip containing the semiconductor memory is thereby reduced.

FIG. 3 shows the layout for an example of a configuration of the gate electrodes 135, 136 of the switching transistors 8, 9 which is bent in the direction of the bit lines. Corresponding elements compared with FIG. 2 are provided with the same reference symbols. The configuration shows the transistors 8, 9 with the common doping region 131. The other doping region of the main current path of the transistors 8, 9 is identified by 140 and 141, respectively. The bit lines (not illustrated) are connected to the latter doping regions via the contacts 133, 134. The contact 132 connects the common doping region 131 to the collective line bLDQ (not illustrated). The contact 132 is placed between the gate electrodes 135, 136 in order to save space. The collective lines expediently run directly above the contact 132 in the second metallization plane. An alternative connection to the other collective line LDQ may be produced by a contact at the location 132'. The collective lines can also run outside the area occupied by the transistors 8, 9, in which case a connection from the respective contact 132 and 132' to the corresponding collective line is produced by a further metal interconnect in the first wiring plane.

In order to obtain a smaller depth for the transistors 8, 9 in the direction of the bit lines, the gate electrodes 135, 136 are bent between the doping regions 140, 131, 141, the respective rectilinear sections, e.g. 136a, 136b, having directional components in both the vertical and horizontal directions. In principle, it is also conceivable for the profile of the strip-type gate electrodes to have multiple direction changes and bends.

We claim:

1. A semiconductor memory, comprising:

two memory cells storing information to be stored in an inverted fashion;

two memory cells storing information to be stored in a non-inverted fashion;

two inverted bit lines, one of said two inverted bit line connected respectively to each of said memory cells storing information to be stored in an inverted fashion, said two inverted bit lines disposed adjacent to one another and carrying the information from said two memory cells storing the information to be stored in the inverted fashion;

two non-inverted bit lines, one of said two non-inverted bit line connected respectively to each of said memory cells storing the information to be stored in a non-inverted fashion;

an adjacent bit line defined by said two inverted bit lines and said two non-inverted bit lines, said two inverted bit lines disposed adjacent to said two non-inverted bit lines without a further bit line situated therebetween;

a switching transistor having a common terminal, said switching transistor connected to one of said two inverted bit lines and one of said two non-inverted bit lines; and collective lines including an inverted collective line and a non-inverted collective line, said inverted collective line connected to said switching transistor and said two inverted bit lines, and said non-inverted collective line connected to said switching transistor and said two non-inverted bit lines, one of said inverted collective line and said non-inverted collective line connecting to said common terminal.

2. The semiconductor memory according to claim 1, wherein said switching transistor has a common doping region.

3. The semiconductor memory according to claim 2, wherein said common doping region is contact-connected to one of said collective lines.

4. The semiconductor memory according to claim 2, further comprising:

a transistor having a switch function; and a gate electrode disposed on said edge, said gate electrode to receive a switching signal controlling said switching function.

5. The semiconductor memory according to claim 4, wherein said gate electrode has a bent profile along said common doping region.

6. The semiconductor memory according to claim 1, including a sensor amplifier configured as a differential amplifier having input terminals, output terminals, an inverted bit line of said two inverted bit lines and an adjacently disposed non-inverted bit line of said two non-inverted bit lines are in each case connected to said input terminals and said output terminals of said sense amplifier.

7. The semiconductor memory according to claim 1, wherein a first inverted bit line of said two inverted bit lines is disposed adjacent to a second inverted bit line of said two inverted bit lines, said second inverted bit line is disposed adjacent to a first non-inverted bit line of said two non-inverted bit lines, and said first non-inverted bit line is disposed adjacently to a second non-inverted bit line of said two non-inverted bit lines, and said two inverted bit lines and said two non-inverted bit lines being without further bit lines situated therebetween.

8. The semiconductor memory according to claim 1, including a first metallization plane and a second metallization plane, said two inverted bit lines and said two non-inverted bit lines lie in said first metallization plane and said collective lines lie in said second metallization plane.

9. The semiconductor memory according to claim 2, wherein said common doping region has an edge.

* * * * *